United States Patent [19]

Malhi

[11] Patent Number: 4,662,061
[45] Date of Patent: May 5, 1987

[54] METHOD FOR FABRICATING A CMOS WELL STRUCTURE

[75] Inventor: Satwinder Malhi, Garland, Tex.

[73] Assignee: Texas Instruments Incorporated, Dallas, Tex.

[21] Appl. No.: 706,431

[22] Filed: Feb. 27, 1985

[51] Int. Cl.[4] ......................................... H01L 21/263
[52] U.S. Cl. ..................... 29/576 B; 29/571; 29/576 W; 148/1.5; 148/187; 148/DIG. 82; 357/42; 357/91
[58] Field of Search ............... 29/576 B, 571, 576 W; 148/1.5, 187; 357/42, 91

[56] References Cited

U.S. PATENT DOCUMENTS

| | | | |
|---|---|---|---|
| 3,370,995 | 2/1968 | Lowery et al. | 148/175 |
| 3,414,782 | 12/1968 | Lin et al. | 148/DIG. 85 |
| 4,106,954 | 8/1978 | DeBrebisson et al. | 148/1.5 |
| 4,295,898 | 10/1981 | Yoshida et al. | 148/1.5 |
| 4,385,946 | 5/1983 | Finegan et al. | 148/1.5 |
| 4,406,710 | 9/1983 | Davies et al. | 148/1.5 |
| 4,470,852 | 9/1984 | Ellsworth | 148/1.5 |
| 4,471,523 | 9/1984 | Hu | 29/571 |
| 4,506,436 | 3/1985 | Bakeman, Jr. et al. | 148/1.5 |
| 4,525,920 | 7/1985 | Jacobs et al. | 29/571 |

OTHER PUBLICATIONS

Edel, W. A., IBM-TDB, 14 (1971) 1654.

*Primary Examiner*—Upendra Roy
*Attorney, Agent, or Firm*—Douglas A. Sorensen; Kenneth C. Hill; James T. Comfort

[57] ABSTRACT

A process is disclosed for fabricating N-wells in a P-type substrate. An N-type epitaxial layer is formed on the surface of a P+ substrate. The N-type epitaxial layer is then masked and a doubly charged boron implant is performed on the exposed areas of the N-type epitaxial layer. Because of the lower mass of boron, a common production 200 kiloelectron volt implanter provides sufficient implantation energy to doubly charged boron to provide a P region which extends through the N-type epitaxial layer. The remaining N-type portions of the epitaxial layer provide N-wells for the fabrication of complementary field effect transistor circuitry.

2 Claims, 7 Drawing Figures

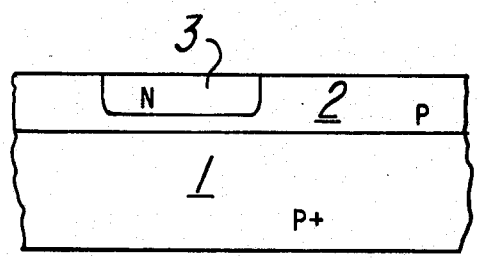
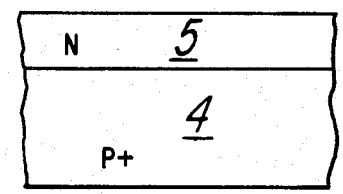
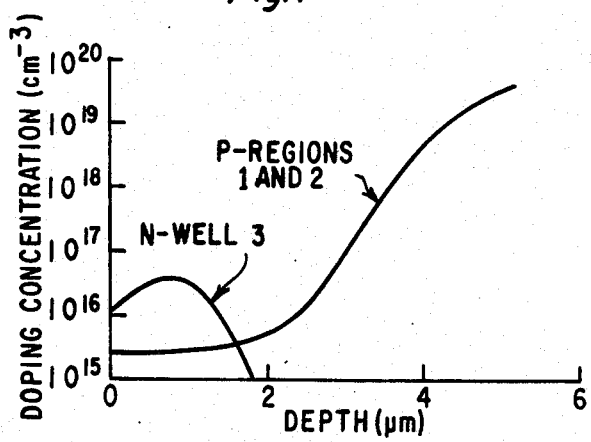
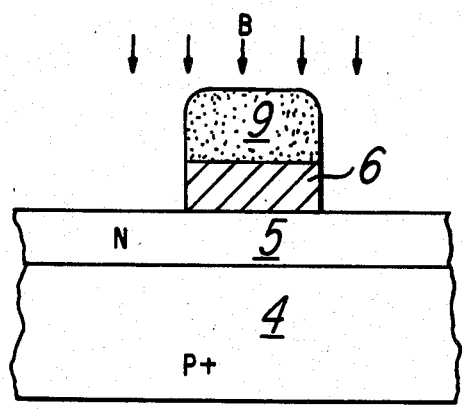
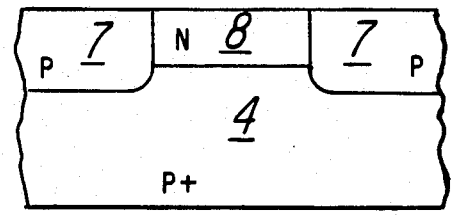

METHOD FOR FABRICATING A CMOS WELL STRUCTURE

FIELD OF THE INVENTION

This invention relates to the field of integrated circuit fabrication. More specifically, this invention relates to the field of complementary field effect transistor circuit fabrication.

BACKGROUND OF THE INVENTION

In order to fabricate complementary metal oxide semiconductor (CMOS) integrated circuits, a substrate structure which includes P wells in an N-type substrate, N wells in as a P-type substrate, or regions of both types must be fabricated. This follows from the fact that N-channel field effect transistors must be fabricated in P-type semiconductor material and P-channel field effect transistors must be fabricated in N-type material.

A structure which includes an N well formed in a P-type epitaxial layer on a P+ substrate is shown in FIG. 1. P-type epitaxial layer 2 is formed on the surface of P+ substrate 1 using techniques well known in the art. P type epitaxial layer 2 is approximately 4½ microns thick. An ideal depth for N well 3 for the fabrication of submicron geometry field effect transistors is approximately 2 microns. In order to fabricate a well having this depth, an implantation of phosphorous or arsenic is made which has a peak implant density at approximately 0.9 microns below the surface of epitaxial layer 2. An implantation to this depth requires an implant energy of approximately 800 kiloelectron volts. Most production type implanters available provide an energy of up to 200 kiloelectron volts. Thus special high energy implanters are necessary to provide an 800 kiloelectron volt implantation energy. Because these special high energy implanters are more expensive than common production type implanters, additional expense is required to establish a production line for the fabrication of the structure of FIG. 1. FIG. 2 is a doping profile of the structure of FIG. 1.

SUMMARY OF THE INVENTION

One embodiment of the present invention provides a process for fabricating N wells in a P type substrate. An N type epitaxial layer is formed on the surface of a P+ substrate. The N epitaxial layer is then masked and a doubly charged boron implant is performed on the exposed areas of the N type epitaxial layer. Because of the lower mass of boron as compared to phosphorous and arsenic, a common production 200 kiloelectron volt implanter can place the doubly charged boron implant peak sufficiently deep that with subsequent drive-in the P-region extends through the N-type epitaxial layer. The remaining N-type portions of the epitaxial layer provide N-wells for the fabrication of complementary field effect transistor circuitry.

DESCRIPTION OF THE DRAWINGS

FIG. 1 is a side-view schematic drawing of a prior art structure for the fabrication of CMOS circuitry;

FIG. 2 is a doping profile of the structure of FIG. 1;

FIGS. 3A through 3C are side-view schematic drawings depicting the processing steps necessary to fabricate one embodiment of the present invention.

DETAILED DESCRIPTION

Figure 4A:
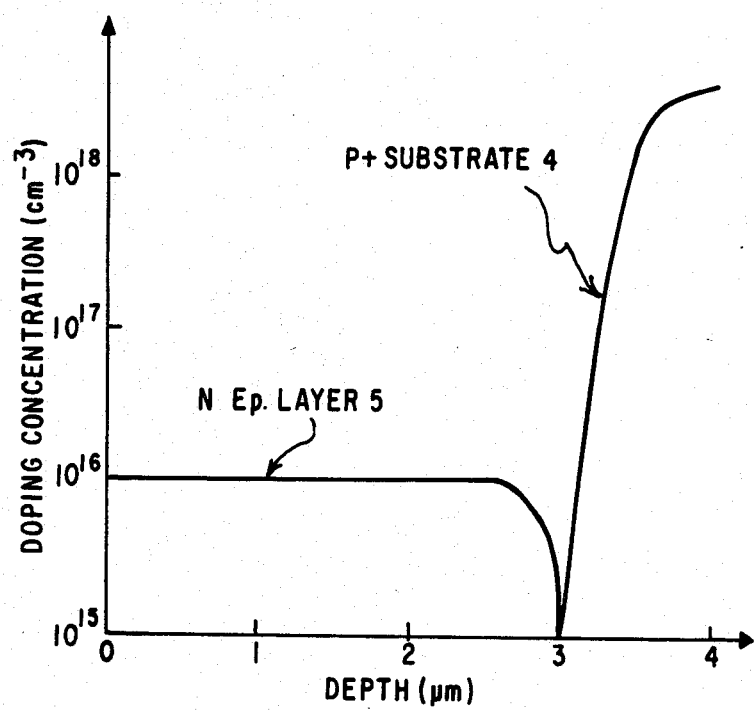
FIGS. 4A and 4B are doping profiles of the structures depicted in FIGS. 3A and 3C.

FIGS. 3A through 3C are side-view schematic drawings depicting the processing steps of one embodiment of the present invention. N-type epitaxial layer 5 of FIG. 1 is formed on the surface of P+ substrate 4 doped to about $10^{19}$ cm$^{-3}$ using techniques well known in the art to a thickness of 3 microns. FIG. 4A is a doping profile of the structure of FIG. 3A.

An implantation mask, composed of silicon dioxide layer 6, which is approximately 0.5 micron thick and photoresist layer 9, is then formed on the surface of N type epitaxial layer 5 as shown in FIG. 3B. The structure of FIG. 3B is then subjected to a boron ion implantation of doubly charged boron ions having a density of approximately $10^{13}$ cm$^{-2}$ squared and an energy of approximately 400 kiloelectron-volts. Because these boron ions are doubly charged, a common production type implanter with a maximum energy of approximately 200 kiloelectron volts can provide boron ions having energies of 400 kiloelectron volts. This follows from the fact that the energy of the particle being accelerated by an implanter is directly proportional to the charge of the particle. The boron implant is then annealed which distributes this implant and also diffuses the boron from the substrate upwards to provide P-regions 7 as shown in FIG. 3C. P-regions 7 extend completely through N type epitaxial layer 5 (FIG. 3B) and leave N well 8 as shown in FIG. 3C.

Figure 4B:
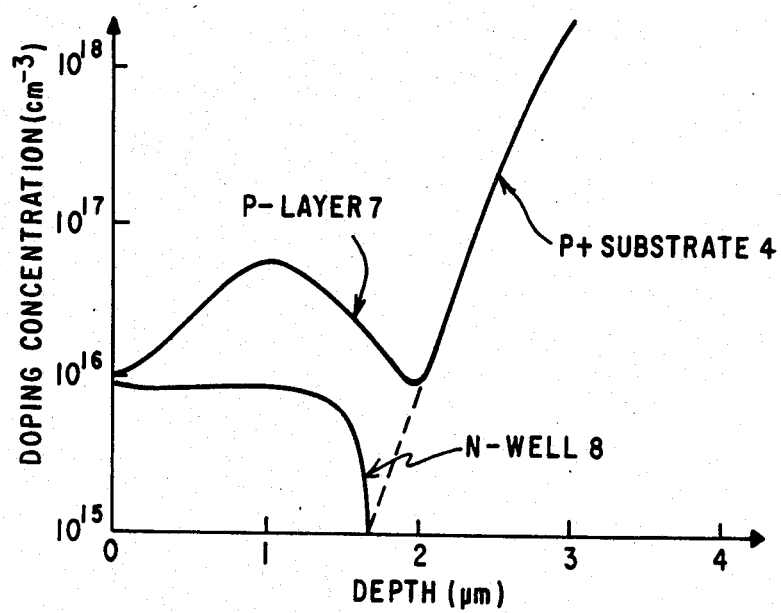

The doping profile of the structure of FIG. 3C is shown in FIG. 4B. Note that the final n-well depth is also reduced to about 1.5 micron due to boron diffusion up from the substrate. Thus the process of this embodiment of the present invention provides an N-well structure for the fabrication of complementary field effect transistors using a low energy implantation device, thus avoiding capital expenditures for a higher energy implantation machine.

TECHNICAL ADVANTAGES

The present invention provides a process for the fabrication of an N-well structure on a P-type substrate while using an implantation device having an implantation energy capability ¼ that of the energy required for fabrication of a similar structure in the prior art.

I claim:

1. A process for fabricating an N-well structure, comprising the steps of:
    forming a semiconductor epitaxial layer which is doped n-type on a p-type semiconductor substrate;
    implanting doubly-charged boron (B++) ions into said epitaxial layer except in selected regions of said epitaxial layer, said implantation having a sufficient energy and concentration to completely counterdope said epitaxial layer to p-type except in said selected regions.

2. A process for fabricating an N well structure, comprising the steps of:
    forming an N type semiconductor epitaxial layer having a thickness of approximately 3 microns on a P type semiconductor substrate;
    implanting doubly charged boron ions (B++ ions) said epitaxial layer except in selected regions of said epitaxial layer, said implantation having an energy of approximately 400 kiloelectronvolts and a concentration of approximately 1E13/cm-squared; and
    annealing and driving in boron ions implanted by said implanting step, to completely counterdope said epitaxial layer to said second conductivity type.

* * * * *